US012740471B2

(12) United States Patent
Nishimura et al.

(10) Patent No.: US 12,740,471 B2
(45) Date of Patent: Sep. 15, 2026

(54) POWER SEMICONDUCTOR MODULE

(71) Applicant: Sansha Electric Manufacturing Co., Ltd., Osaka (JP)

(72) Inventors: Naoki Nishimura, Osaka (JP); Masashi Fukai, Osaka (JP)

(73) Assignee: SANSHA ELECTRIC MANUFACTURING CO., LTD., Osaka (JP)

( * ) Notice: Subject to any disclaimer, the term of this patent is extended or adjusted under 35 U.S.C. 154(b) by 659 days.

(21) Appl. No.: 18/021,816

(22) PCT Filed: Sep. 15, 2020

(86) PCT No.: PCT/JP2020/034824
§ 371 (c)(1),
(2) Date: Feb. 17, 2023

(87) PCT Pub. No.: WO2022/059052
PCT Pub. Date: Mar. 24, 2022

(65) Prior Publication Data
US 2023/0360991 A1 Nov. 9, 2023

(51) Int. Cl.
*H10W 74/10* (2026.01)
*H10D 62/832* (2025.01)
(Continued)

(52) U.S. Cl.
CPC ...... *H10W 74/127* (2026.01); *H10D 62/8325* (2025.01); *H10W 40/255* (2026.01);
(Continued)

(58) Field of Classification Search
CPC ............. H01L 23/3142; H01L 23/3736; H01L 23/49811; H01L 23/647; H01L 23/32;
(Continued)

(56) References Cited

U.S. PATENT DOCUMENTS

2011/0227095 A1* 9/2011 Treu ..................... H03K 17/567 257/77
2013/0092948 A1* 4/2013 Otsuka ................ H10W 70/635 257/770
(Continued)

FOREIGN PATENT DOCUMENTS

CN 108140616 A 6/2018
JP 2001185679 A 7/2001
(Continued)

OTHER PUBLICATIONS

Office Action issued in corresponding Chinese Patent Application No. 202080102229.X dated Dec. 27, 2024 (11 pages).
(Continued)

*Primary Examiner* — Dale E Page
*Assistant Examiner* — Genevieve G Bullard-Connor
(74) *Attorney, Agent, or Firm* — Kilyk & Bowersox, P.L.L.C.

(57) ABSTRACT

An object is to provide a power semiconductor module having a small ON-resistance and capable of operating at a high frequency. Included are: a semiconductor chip 2 configured to supply a power source, and including a voltage-driven switching element, and a gate electrode 20G provided on a main surface of the semiconductor chip 2; a heat dissipation sheet 3 disposed opposite the main surface of the semiconductor chip 2, and configured to dissipate heat of the semiconductor chip 2; a wiring board 4 disposed between the semiconductor chip 2 and the heat dissipation sheet 3, and including a gate wiring pattern 40G connected to an external terminal 6G; an interposer 5 including a sheet-like base material disposed between the semiconductor chip 2 and the wiring board 4, and a gate resistor 50G in the sheet-like base material and interposed between the gate electrode 20G and the gate wiring pattern 40G; and a resin
(Continued)

POWER SEMICONDUCTOR MODULE 100 housing 7 that seals the semiconductor chip 2, the wiring board 4, and the interposer 5.

4 Claims, 3 Drawing Sheets

(51) Int. Cl.

| | |
|---|---|
| ***H10W 40/25*** | (2026.01) |
| ***H10W 44/00*** | (2026.01) |
| ***H10W 70/65*** | (2026.01) |
| ***H10W 90/00*** | (2026.01) |

(52) U.S. Cl.

CPC ....... *H10W 40/258* (2026.01); *H10W 44/401* (2026.01); *H10W 70/658* (2026.01); *H10W 90/401* (2026.01); *H10W 90/701* (2026.01); *H10W 74/114* (2026.01); *H10W 90/734* (2026.01)

(58) Field of Classification Search

CPC H01L 2924/13091; H01L 2224/32225; H10D 62/8325; H10D 62/411–491; H10D 30/64–669; H10D 84/141–161; H10W 40/255; H10W 40/258; H10W 44/401; H10W 70/611; H10W 70/658; H10W 72/30; H10W 72/60; H10W 74/114; H10W 74/127; H10W 90/401; H10W 90/701; H10W 90/734

See application file for complete search history.

(56) References Cited

U.S. PATENT DOCUMENTS

| | | | | |
|---|---|---|---|---|
| 2016/0351504 | A1 | 12/2016 | Teshima et al. | |
| 2017/0077068 | A1 * | 3/2017 | Horio | H10D 12/441 |
| 2018/0040593 | A1 * | 2/2018 | Zhou | H10W 90/00 |
| 2018/0254252 | A1 | 9/2018 | Nakagawa et al. | |
| 2020/0020635 | A1 * | 1/2020 | Chang | H10W 70/611 |

FOREIGN PATENT DOCUMENTS

| | | | |
|---|---|---|---|
| JP | 2004006603 | A | 1/2004 |
| JP | 2005039226 | A | 2/2005 |
| JP | 2007080946 | A | 3/2007 |
| JP | 2016092039 | A | 5/2016 |
| JP | 2016195223 | A | 11/2016 |
| JP | WO2014087877 | A1 | 1/2017 |
| WO | 2016052221 | A1 | 4/2016 |

OTHER PUBLICATIONS

International Search Report and Written Opinion issued in corresponding International Patent Application No. PCT/JP2020/034824 (with English translation of International Search Report) mailed Nov. 24, 2020 (5 pages).

Extended European Search Report issued in corresponding European Patent Application No. 20954038.4 dated Jun. 5, 2024 (5 pages).

* cited by examiner

POWER SEMICONDUCTOR MODULE

This application is a National Stage Application of PCT/JP2020/034824, filed Sep. 15, 2020.

TECHNICAL FIELD

The present invention relates to a power semiconductor module, and more particularly to a power semiconductor module in which a voltage-controlled semiconductor chip is sealed with resin.

BACKGROUND ART

Since a large current flows through a semiconductor chip for power source supply, heat loss is large, and heat dissipation processing is required. Therefore, widely used is a power semiconductor module including a semiconductor chip sealed with resin, and a heat dissipation sheet that discharges heat of the semiconductor chip to the outside of a resin housing.

A silicon-carbide metal-oxide-semiconductor field-effect transistor (SiC-MOSFET) in which a metal-oxide-semiconductor field-effect transistor (MOSFET) is formed on a silicon carbide substrate, and an insulated-gate bipolar transistor (IGBT) have characteristics including a small ON-resistance and a high switching speed. Such a switching element is used so as to build a power semiconductor module that can be used at a high-frequency region.

However, in a case where a switching element for a power source is to be operated at a high-frequency region, there is a problem that a loss in the gate resistor significantly increases and exceeds an allowable loss of a general resistance element.

The MOSFET and the IGBT are voltage-driven switching elements having high input impedance. For the voltage-driven switching element, it is necessary to adjust a switching time to suppress inrush current and ringing (damped oscillation), and a gate resistor is connected to the gate terminal. For example, a gate driving circuit and a gate resistor are disposed on a printed circuit board, and the gate driving circuit is connected to a power semiconductor module via the gate resistor.

Assuming that the gate capacitance of the semiconductor chip is Qg, the gate voltage is Vg, and the operating frequency is fc, the power consumed in the gate resistor is $P=Qg \times fc \times Vg$.

For example, for a switching element that is for a power source and handles a large current of 100 A or larger, a large chip size is ensured, so that the ON-resistance is made small to suppress the ON-loss. Therefore, the gate capacitance Qg becomes a large value according to the chip size. In addition, for example, in a case where a high-frequency continuous operation of 100 kHz or higher is performed, the operation frequency fc also becomes a large value.

Therefore, when the switching element for a power source is to be operated continuously at a high frequency, the loss in the gate resistor significantly increases to reach several W, which exceeds an allowable loss of a general resistance element. As a result, it is necessary to increase the allowable loss by, for example, connecting a large number of resistance elements in parallel or attaching heat dissipation devices to the resistance elements, which causes problems including an increase in the size of the power source device, and an increase in the cost.

SUMMARY OF INVENTION

Technical Problem

The present invention has been made in view of the above circumstances, and an object of the present invention is to provide a power semiconductor module having a small ON-resistance and capable of operating at a high frequency.

Solution to Problem

A power semiconductor module according to a first aspect of the present invention includes: a semiconductor chip configured to supply a power source, and including a voltage-driven switching element, and a gate electrode provided on a main surface of the semiconductor chip; a heat dissipation sheet disposed opposite the main surface of the semiconductor chip, and configured to dissipate heat of the semiconductor chip; a wiring board disposed between the semiconductor chip and the heat dissipation sheet, and including gate wiring connected to a first external terminal; an interposer including a sheet-like base material disposed between the semiconductor chip and the wiring board, and a gate resistor in the sheet-like base material and interposed between the gate electrode and the gate wiring; and a resin housing that seals the semiconductor chip, the wiring board, and the interposer.

Such a configuration is adopted, so that the heat dissipation sheet is disposed on the gate electrode side of the semiconductor chip, and the gate resistor is disposed on a heat dissipation path from the semiconductor chip to the heat dissipation sheet. Therefore, the heat dissipation sheet for the semiconductor chip is utilized to also dissipate heat of the gate resistor, and the allowable loss of the gate resistor is increased without significant increases in the manufacturing cost and the device size. In addition, the interposer including the gate resistor is used, so that the same semiconductor chip is combined with the interposer having different resistance values of the gate resistor, so that the power semiconductor module compatible with various operating conditions is provided while suppressing the manufacturing cost.

In a power semiconductor module according to a second aspect of the present invention, in addition to the above configuration, the gate resistor is a resistance region of the sheet-like base material, and the resistance region is through the sheet-like base material in a thickness direction, and on a first main surface of the sheet-like substrate, the gate resistor is connected to the gate electrode, and on a second main surface of the sheet-like substrate, the gate wiring is connected to the gate resistor.

Such a configuration is adopted, so that heat of the gate resistor is effectively dissipated without a significant decrease in the heat dissipation efficiency of the semiconductor chip. In addition, an increase in inductance caused by the provision of the gate resistor is suppressed, and good high-frequency characteristics are obtained.

In a power semiconductor module according to a third aspect of the present invention, in addition to the above configuration, the sheet-like base material is a semiconductor substrate, and the gate resistor is an impurity diffusion region in the semiconductor substrate.

Since such a configuration is adopted, so that a semiconductor manufacturing technique is utilized to produce the interposer, the highly reliable power semiconductor module is provided at a low price.

In a power semiconductor module according to a fourth aspect of the present invention, in addition to the above configuration, on the main surface of the semiconductor chip is at least one controlled electrode, on the wiring board is power supply wiring connected to a second external terminal, the interposer includes a wiring-coupling unit that connects the controlled electrode with the power supply wiring, and the gate resistor has a resistance value higher than a resistance value of the wiring-coupling unit.

Such a configuration is adopted, so that the power semiconductor module is downsized and provided at a low price.

In a power semiconductor module according to a fifth aspect of the present invention, in addition to the above configuration, the sheet-like base material is a semiconductor substrate, and the gate resistor and the wiring-coupling unit are each an impurity diffusion region in the semiconductor substrate and through the sheet-like base material in a thickness direction.

Such a configuration is adopted, so that heat of the gate resistor is effectively dissipated without a significant decrease in the heat dissipation efficiency of the semiconductor chip. In addition, an increase in inductance caused by the provision of the gate resistor and the wiring-coupling unit is suppressed, and good high-frequency characteristics are obtained. Furthermore, since a semiconductor manufacturing technique is utilized to produce the interposer, the highly reliable power semiconductor module is provided at a low price.

In a power semiconductor module according to a sixth aspect of the present invention, in addition to the above configuration, the semiconductor chip includes a silicon carbide substrate, and the sheet-like base material is a silicon substrate.

Such a configuration is adopted to suppress damage to the semiconductor chip caused by the difference in thermal expansion coefficient between the semiconductor chip and the gate wiring or the power supply wiring.

Advantageous Effects of Invention

According to the present invention, a power semiconductor module having a small ON-resistance and capable of operating at a high frequency is provided. In particular, such a power semiconductor module is downsized and provided at a low price. In addition, damage to the semiconductor chip caused by the difference in thermal expansion coefficient is suppressed, and the reliability of the power semiconductor module is improved.

DESCRIPTION OF EMBODIMENT

Hereinafter, an embodiment of the present invention will be described with reference to the drawings. Herein, for convenience, a power semiconductor module provided with a heat dissipation sheet on the lower side will be described, but the description does not limit the orientation of the semiconductor module according to the present invention during use.

Figure 1:
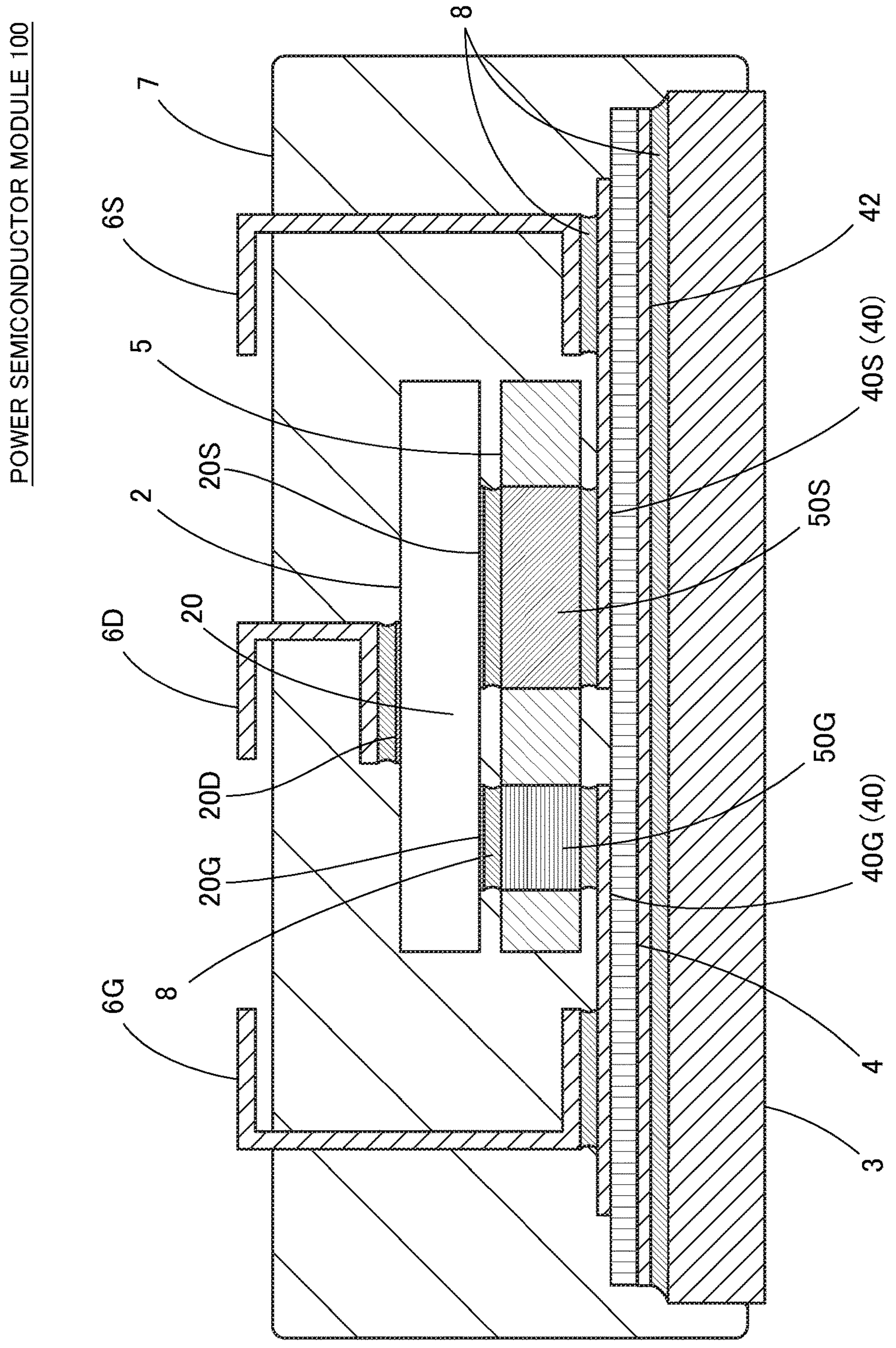
FIG. 1 is a view illustrating a configuration example of a power semiconductor module 100 according to an embodiment of the present invention.

FIG. 1 is a view illustrating a configuration example of a power semiconductor module 100 according to an embodiment of the present invention, and is a cross-sectional view schematically illustrating a state where the power semiconductor module 100 is cut along a cut surface orthogonal to a semiconductor chip 2. The power semiconductor module 100 includes the semiconductor chip 2, a heat dissipation sheet 3, a wiring board 4, an interposer 5, external terminals 6G, 6S, and 6D, and a resin housing 7.

The semiconductor chip 2, the heat dissipation sheet 3, the wiring board 4, and the interposer 5 are substantially parallel to each other, are disposed horizontally, and are disposed in a superimposed manner when viewed from above. The wiring board 4 is disposed between the semiconductor chip 2 and the heat dissipation sheet 3. The interposer 5 is disposed between the semiconductor chip 2 and the wiring board 4.

The semiconductor chip 2 is a semiconductor device including a switching element 20 for power source supply. As the switching element for power source supply, a voltage-driven switching element, for example, a silicon-carbide metal-oxide-semiconductor field-effect transistor (SiC-MOSFET) is used. The SiC-MOSFET is a MOSFET formed on a silicon carbide (SiC) substrate, and has a small ON-resistance and a high switching speed. Therefore, the SiC-MOSFET can supply a large current, and can operate at a high frequency.

The MOSFET includes a gate electrode 20G, a source electrode 20S, and a drain electrode 20D. The gate electrode 20G is a control terminal having sufficiently high input impedance. The source electrode 20S and the drain electrode 20D are controlled terminals. Conduction or non-conduction between the source electrode 20S and the drain electrode 20D is controlled by a gate voltage. The gate electrode 20G and the source electrode 20S are formed on the lower surface of the semiconductor chip 2. The drain electrode 20D is formed on the upper surface of the semiconductor chip 2.

The heat dissipation sheet 3 is a member for discharging heat generated in the resin housing 7 to the outside, and is, for example, a metal sheet of copper Cu, aluminum Al, or the like. The lower surface of the heat dissipation sheet 3 is a heat discharging surface exposed from the resin housing 7. The heat discharging surface is in close contact with the installation surface to which the power semiconductor module 100 is attached, so that heat in the resin housing 7 is discharged. Heat of the semiconductor chip 2 is conducted to the heat dissipation sheet 3 via the interposer 5 and the wiring board 4, and discharged to the outside. Similarly, heat of a wiring-coupling unit 50G is also conducted to the heat dissipation sheet 3 via the wiring board 4, and discharged to the outside.

The wiring board 4 is an insulating substrate, such as a ceramic sheet, on which a wiring pattern 40 is formed to connect the semiconductor chip 2 with the external terminals 6G and 6S. The wiring pattern 40 is formed by patterning, by a photolithography technique, a copper sheet attached to the upper surface of the wiring board 4. The wiring pattern 40 includes a gate wiring pattern 40G connected to the gate electrode 20G, and a source wiring pattern 40S connected to the source electrode 20S. The source wiring pattern 40S is power supply wiring through which a power supply current flows.

In addition, the wiring board 4 is disposed between the heat dissipation sheet 3 and the interposer 5 to insulate the heat dissipation sheet 3. The lower surface of the wiring board 4 is joined to the upper surface of the heat dissipation sheet 3 via a solder layer 8. A copper sheet 42 is for improving solder wettability of the lower surface of the wiring board 4, and is attached to the entire lower surface of the wiring board 4.

The interposer 5 is made of a sheet-like base material through which the wiring-coupling unit 50G and a wiring-coupling unit 505 are formed in a thickness direction. The interposer 5 is disposed between the semiconductor chip 2 and the wiring board 4. The wiring-coupling unit 50G is a resistance element interposed between the gate electrode 20G and the gate wiring pattern 40G. The wiring-coupling unit 50G is used as a gate resistor. The wiring-coupling unit 50S is wiring that connects the source electrode 20S with the source wiring pattern 40S. That is, while the wiring-coupling unit 50G functions as a gate resistor, the wiring-coupling unit 50S has a resistance value sufficiently smaller than the resistance value of the gate resistor, and functions as wiring through which a power supply current flows. For example, the resistance value of the wiring-coupling unit 50G is 1Ω or larger, whereas the resistance value of the wiring-coupling unit 50S is 1 mΩ or smaller.

The interposer 5 is manufactured using a publicly known technique for manufacturing a semiconductor device. For example, partial regions on the main surface of a semiconductor substrate, such as a silicon substrate, are doped with an impurity, such as phosphorus or boron, so that conductive regions are formed through in a thickness direction. The conductive regions thus formed are used as the wiring-coupling units 50G and 50S. The resistance values of the wiring-coupling units 50G and 505 are controlled by the impurity concentration. The impurity concentration of the wiring-coupling unit 505 is higher than the impurity concentration of the wiring-coupling unit 50G, so that the wiring-coupling unit 505 having a sufficiently small resistance value is formed.

The lower ends of the wiring-coupling units 50G and 505 are connected to the wiring patterns 40G and 40S of the wiring board 4 by soldering. In addition, the upper ends of the wiring-coupling units 50G and 50S are connected to the electrodes 20G and 20S of the semiconductor chip 2 by soldering. That is, the lower surface of the interposer 5 is joined to the upper surface of the wiring board 4 via a solder layer 8, and the upper surface of the interposer 5 is joined to the lower surface of the semiconductor chip 2 via a solder layer 8.

The external terminals 6G, 6S, and 6D are terminals through which the electrodes 20G, 20S, and 20D of the semiconductor chip 2 lead out to the outside of the resin housing 7. Part of the external terminals 6G, 6S, and 6D are exposed from the resin housing 7. The external terminal 6G is connected to the gate wiring pattern 40G. The external terminal 6S is connected to the source wiring pattern 40S. The external terminal 6D is connected to the drain electrode 20D of the semiconductor chip 2.

The resin housing 7 seals the semiconductor chip 2, the heat dissipation sheet 3, the wiring board 4, the interposer 5, and the external terminals 6G, 6S, and 6D, such that the lower surface of the heat dissipation sheet 3 and part of the external terminals 6G, 6S, and 6D are exposed from the resin housing 7.

Heat generated in the semiconductor chip 2 propagates to the heat dissipation sheet 3 via the interposer 5 and the wiring board 4, and is discharged from the lower surface of the heat dissipation sheet 3 to the outside of the power semiconductor module 100. Similarly, heat generated in the gate resistor (wiring-coupling unit 50G) also propagates to the heat dissipation sheet 3 via the wiring board 4, and is discharged from the lower surface of the heat dissipation sheet 3 to the outside of the power semiconductor module 100. That is, a configuration in which the wiring board 4 is disposed between the semiconductor chip 2 and the heat dissipation sheet 3, the interposer 5 is further disposed between the semiconductor chip 2 and the wiring board 4, and the interposer 5 has the gate resistor is adopted, so that a heat dissipation path of the semiconductor chip 2 is utilized to also dissipate heat of the gate resistor in the same direction as the direction of heat dissipation of the semiconductor chip 2. Therefore, the allowable loss of the gate resistor is increased without an increase in the size of the power source device and a significant increase in the manufacturing cost.

In addition, since the gate resistor is formed as the wiring-coupling unit 50G that is through the interposer 5, an increase in inductance caused by wiring is suppressed, and good high-frequency characteristics are obtained.

In addition, since the gate resistor is not provided on the semiconductor chip 2 but is provided for the interposer 5, the power semiconductor module having different operating conditions can be manufactured using the same semiconductor chip. Therefore, the power semiconductor module is provided at a lower price.

In addition, since the interposer 5 is provided, damage to the semiconductor chip 2 caused by a temperature cycle is suppressed, and the reliability of the power semiconductor module 100 is improved. The heat dissipation sheet 3 and the wiring pattern 40 are made of a metal material, such as copper Cu or aluminum Al, whereas the semiconductor chip 2 is made of silicon carbide SiC, and thus the linear expansion coefficients of the heat dissipation sheet 3 and the wiring pattern 40, and the semiconductor chip 2 are greatly different from each other. Therefore, in a conventional power semiconductor module without the interposer 5, a large stress is generated in the semiconductor chip 2 at a high temperature. In particular, a large stress is generated on the lower surface of the semiconductor chip 2 to which the wiring pattern 40 is directly soldered.

On the other hand, since the interposer 5 made of a material having a thermal expansion coefficient relatively close to the thermal expansion coefficient of the semiconductor chip 2 is disposed between the semiconductor chip 2 and the wiring board 4, damage to the semiconductor chip 2 caused by a temperature cycle is suppressed, and the reliability of the power semiconductor module is improved. Since silicon Si and silicon carbide SiC have relatively close linear expansion coefficients, it is suitable to use a silicon substrate as the sheet-like base material of the interposer 5.

Figure 2:
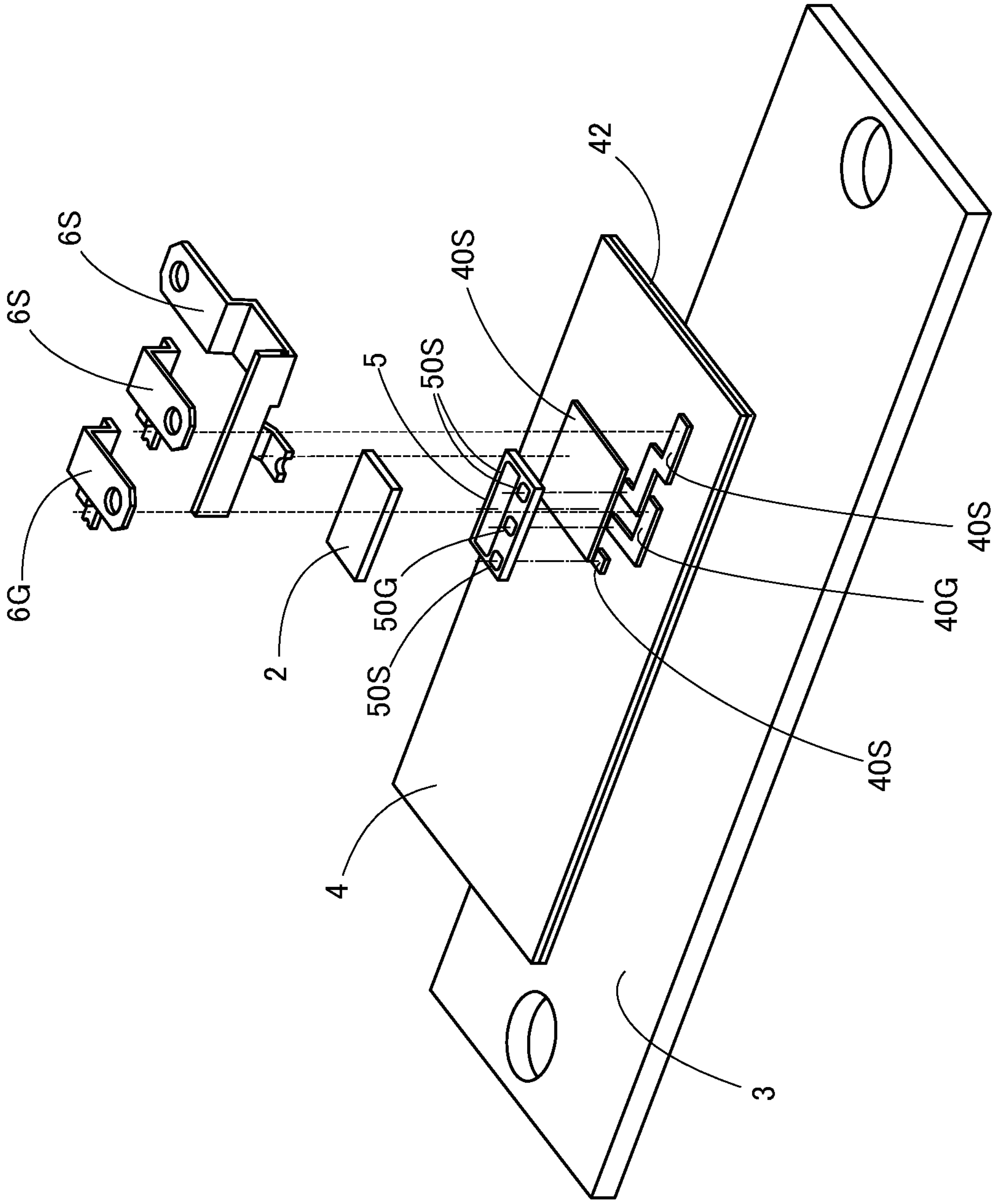
FIG. 2 is an exploded perspective view illustrating main components constituting the power semiconductor module 100 according to the embodiment of the present invention.
Figure 3:
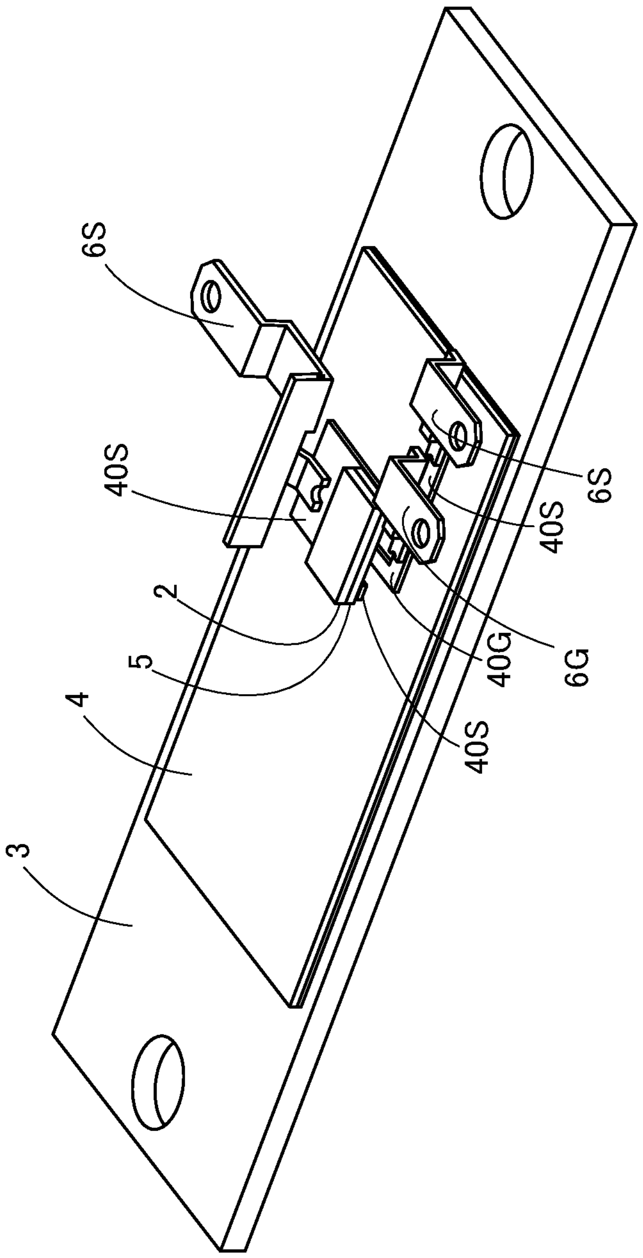
FIG. 3 is a perspective view illustrating a state where the components of FIG. 2 are assembled.

FIG. 2 is an exploded perspective view illustrating main components constituting the power semiconductor module 100 according to the embodiment of the present invention. In addition, FIG. 3 is a perspective view illustrating a state where the components of FIG. 2 are assembled. In FIGS. 2 and 3, the external terminal 6D and the resin housing 7 are omitted.

The semiconductor chip 2 includes one semiconductor switching element. Formed on the lower surface of the semiconductor switching element are one gate electrode 20G and three source electrodes 20S. Note that the three source electrodes 20S are branches of the same electrode 20S of the same semiconductor switching element 20 in the semiconductor chip 2.

One wiring-coupling unit 50G and three wiring-coupling units 505 corresponding to the four electrodes 20G and 20S of the semiconductor chip 2 are formed on the interposer 5. One gate wiring pattern 40G and three source wiring patterns 40S corresponding to the four electrodes 20G and 20S of the semiconductor chip 2 are formed on the wiring board 4.

In the above embodiment, a case where the semiconductor switching element 20 is a SIC-MOSFET has been described, but the present invention is not limited to such a case. For example, the present invention can also be applied to a case where the semiconductor switching element 20 is an insulated-gate bipolar transistor (IGBT). In this case, a silicon substrate is used for the semiconductor chip 2.

In addition, in the above embodiment, a case where the interposer 5 includes the three wiring-coupling units 50S has been described, but the present invention is not limited to such a case. For example, an interposer 5 including at least one wiring-coupling unit 50S can be used. In addition, an interposer 5 including only a wiring-coupling unit 50G and including no wiring-coupling unit 50S can also be used.

DESCRIPTION OF REFERENCE NUMERALS

100 power semiconductor module
2 semiconductor chip
20 switching element for power source supply
20G gate electrode
20S source electrode
20D drain electrode
3 heat dissipation sheet
4 wiring board
40 wiring pattern
40G gate wiring pattern
40S source wiring pattern
42 copper sheet
5 interposer
50G wiring-coupling unit (gate resistor)
505 wiring-coupling unit
6G, 6S, 6D external terminal

The invention claimed is:

1. A power semiconductor module, comprising:
a semiconductor chip including a power transistor and an electrode provided on a surface, the electrode being connected to a gate of the power transistor;
a heat dissipation sheet;
a wiring board disposed on the heat dissipation sheet and including a wiring pattern on a surface of the wiring board;
an interposer disposed between the semiconductor chip and the wiring board and including a resistor penetrating through the interposer;
a busbar extending upward from the wiring board, a first end portion thereof being connected to the wiring pattern on the surface of the wiring board and a second end portion thereof being an external terminal; and
a resin housing that seals the semiconductor chip, the wiring board, the interposer, the heat dissipation sheet, and the busbar except a bottom surface of the heat dissipation sheet and the second end portion of the busbar, wherein
the electrode on the surface of the semiconductor chip and the wiring pattern on the surface of the wiring board are connected to both ends of the resistor penetrating through the interposer,
the interposer is a semiconductor substrate, and
the resistor penetrating through the interposer is an impurity diffusion region in the semiconductor substrate.

2. The power semiconductor module according to claim 1, further comprising:
another busbar extending upward from the wiring board, wherein
the semiconductor chip includes another electrode on the surface, the another electrode being connected to a source of the power transistor,
the wiring board includes another wiring pattern on the surface,
a first end portion of the another busbar is connected to the another wiring pattern on the surface of the wiring board and a second end portion of the another busbar is another external terminal,
the another busbar is sealed by the resin housing except the second end portion,
the interposer includes another resistor penetrating through the interposer, the another resistor having a resistance value greater than the resistor penetrating through the interposer, and
the another electrode on the surface of the semiconductor chip and the another wiring patten on the surface of the wiring board are connected to both ends of the another resistor penetrating through the interposer.

3. The power semiconductor module according to claim 2, wherein
the interposer is a semiconductor substrate, and
the resistor penetrating through the interposer and the another resistor penetrating through the interposer are each an impurity diffusion region in the semiconductor substrate.

4. The power semiconductor module according to claim 1, wherein
the semiconductor chip includes a silicon carbide substrate, and
the interposer is a silicon substrate.

* * * * *